United States Patent

Barron

[15] 3,694,764

[45] Sept. 26, 1972

[54] HIGH POWER AUDIO AMPLIFIER SYSTEM

[72] Inventor: Benjamin Barron, 1335-143rd Street, Whitestone, N.Y. 11357

[22] Filed: Feb. 3, 1970

[21] Appl. No.: 8,230

[52] U.S. Cl. .................330/146, 330/12, 330/207 P, 330/24, 330/26, 330/40, 321/4, 307/202

[51] Int. Cl. ................................................H03f 3/00

[58] Field of Search .........330/146, 20, 40; 321/2, 45, 321/4; 323/75 E, 75 R

[56] References Cited

UNITED STATES PATENTS

| | | |
|---|---|---|
| 3,460,020 | 8/1969 | Quinn......................321/45 X |
| 3,514,688 | 5/1970 | Martin...........................321/2 |
| 3,233,161 | 2/1966 | Sikorra.....................323/75 E |

*Primary Examiner*—Nathan Kaufman
*Attorney*—Sol B. Wiczer

[57] ABSTRACT

The invention disclosed is for a new high power transistorized audio amplifier having a circuit characterized by high efficiency, and light weight resulting from a bridge configuration of power transistors, and a uniquely arranged A.C./D.C. power supply system; low distortion and stable operation over wide temperature variations resulting from a stabilized current driver arrangement which forces opposite arms of the bridge configuration to function identically with "on" bias voltages that are created through uniquely arranged sets of diodes. This arrangement also allows the amplifier units to be connected in parallel directly with the load currents dividing equally between them, automatically.

12 Claims, 4 Drawing Figures

Figure 1:
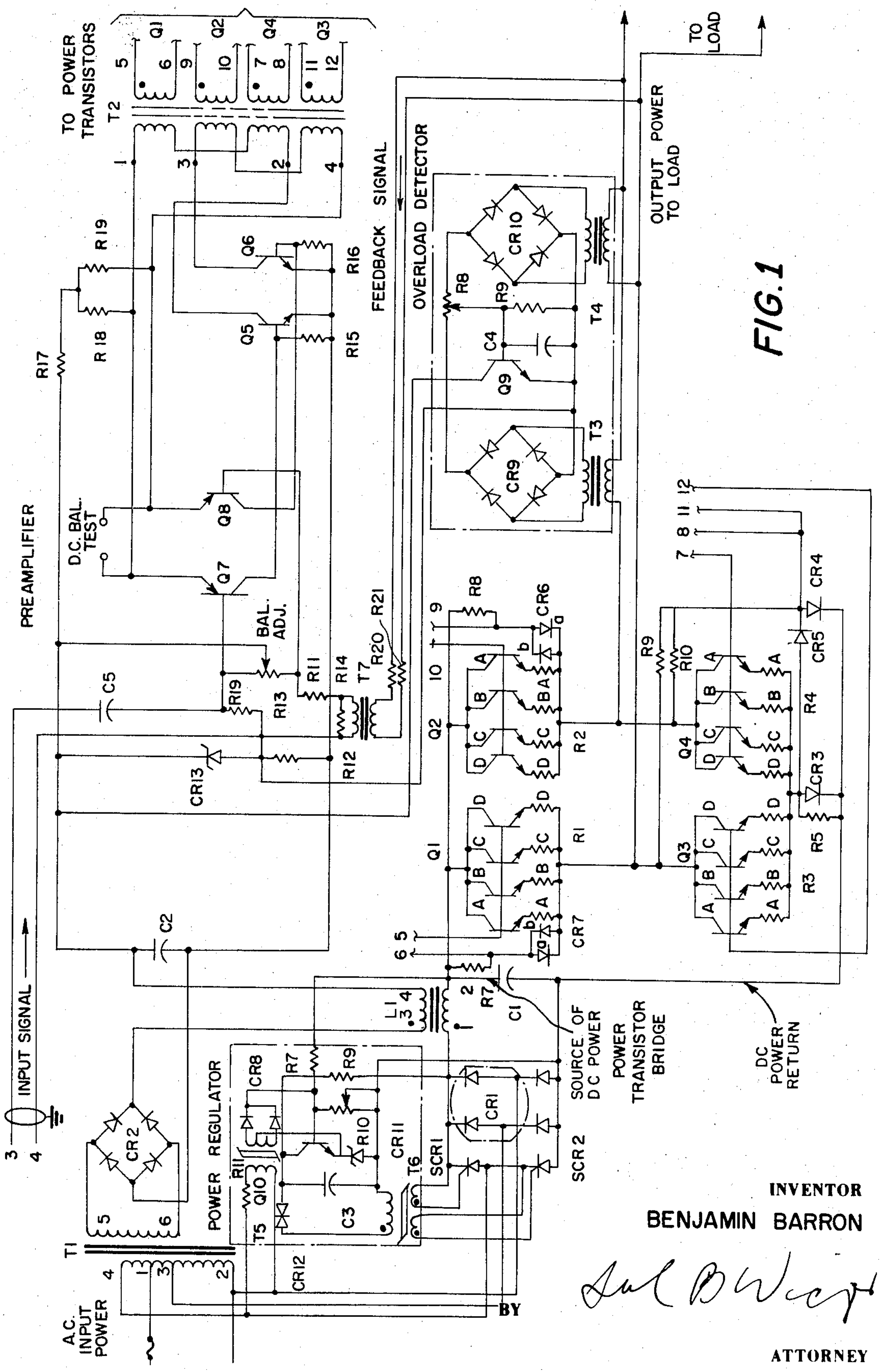

INVENTOR
BENJAMIN BARRON

ATTORNEY

INVENTOR
BENJAMIN BARRON

BY [signature]

ATTORNEY

INVENTOR
BENJAMIN BARRON

BY [signature]

ATTORNEY

HIGH POWER AUDIO AMPLIFIER SYSTEM

SUMMARY OF THE INVENTION

The generation of high accoustic power is often accomplished by a set of power transistors arranged to operate in the familiar class B mode. The operation is usually based on the combination of the transistors and a center-tapped coupling output transformer to the load, transistors coupled directly to the load using a split D.C. power supply, or capacitively coupling the push-pull output to the load through a large valued capacitor. These systems result in unnecessary bulk, reduced bandwidth or distortion. The use of a bridge configuration would overcome these deficiencies except that base drive unbalance results in cross-over distortion. Further, the conventional methods of applying the "on" biasing for the power transistors results in temperature instability of the quiescent operating current in the bridge and poor low frequency response. It is an object of this invention to overcome these difficulties through the use of the uniquely arranged pre-amplifier and resistor-diode biasing system of the power bridge.

In high power transistorized class B amplifiers, transistor power dissipation becomes a limitation on power handling capabilities. It would be desirable to regulate the main D.C. power to remove the necessity for the power transistors to both create the output and compensate for input power line variations. That is, the D.C. power supply voltage is chosen so that the desired output power is delivered at the minimum power input line voltage and maximum output loading before the familiar bottoming occurs. This can be avoided by regulating the D.C. power supply so that it remains substantially unchanged in the presence of power line and load variations. In order to maintain the principle of low power dissipation, the supply must be controlled in a "lossless" manner.

Normally, SCR, magnetic amplifier or equivalent pulse-width system would be used. However, the heavy line distortion resulting from the chopping causes increased ripple voltage in the rectified A.C. power and thus forces the inclusion of larger ripple filtering. This, in turn, results in poor transient response in the regulator. Poor transient response causes momentary bottoming of the output when a large input signal is suddenly applied or an A.C. power line droop occurs suddenly.

It is a further object of this invention to arrange an SCR-Rectifier switching system to provide "lossless" power control without the creation of extra ripple voltage. This keeps the ripple filter size minimized. That allows the use of a fast response pulse controller, which, when combined with the SCR-Rectifier switching system, supresses line and load induced D.C. power transients. The D.C. power supply voltage is thus maintained at the optimum point keeping the power transistor bridge dissipation minimum at the full range of input A.C. voltage from minimum to maximum limits.

Another object of this invention is the slaving of the preamplifier D.C. power source filtering to the main D.C. power system.

The construction of very large audio power amplifiers is simplified by parallel connection of units built as described in this disclosure because the basic problem of current sharing is eliminated through the unique transformer coupled current drive system.

The interaction of forced current control of the output power transistors permits parallel operation of modules without any installation adjustments.

Figures 2, 3:
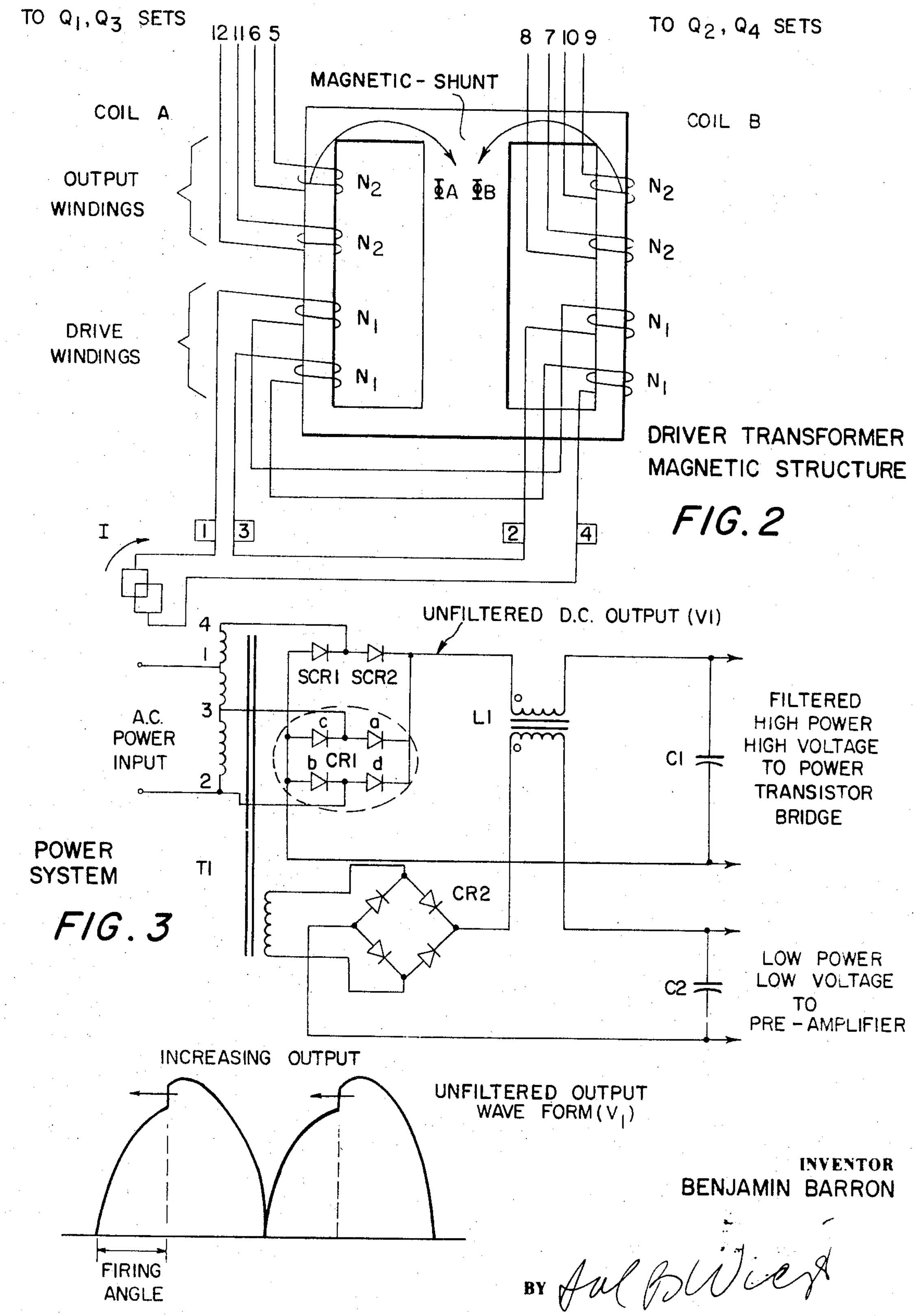
Figure 4:
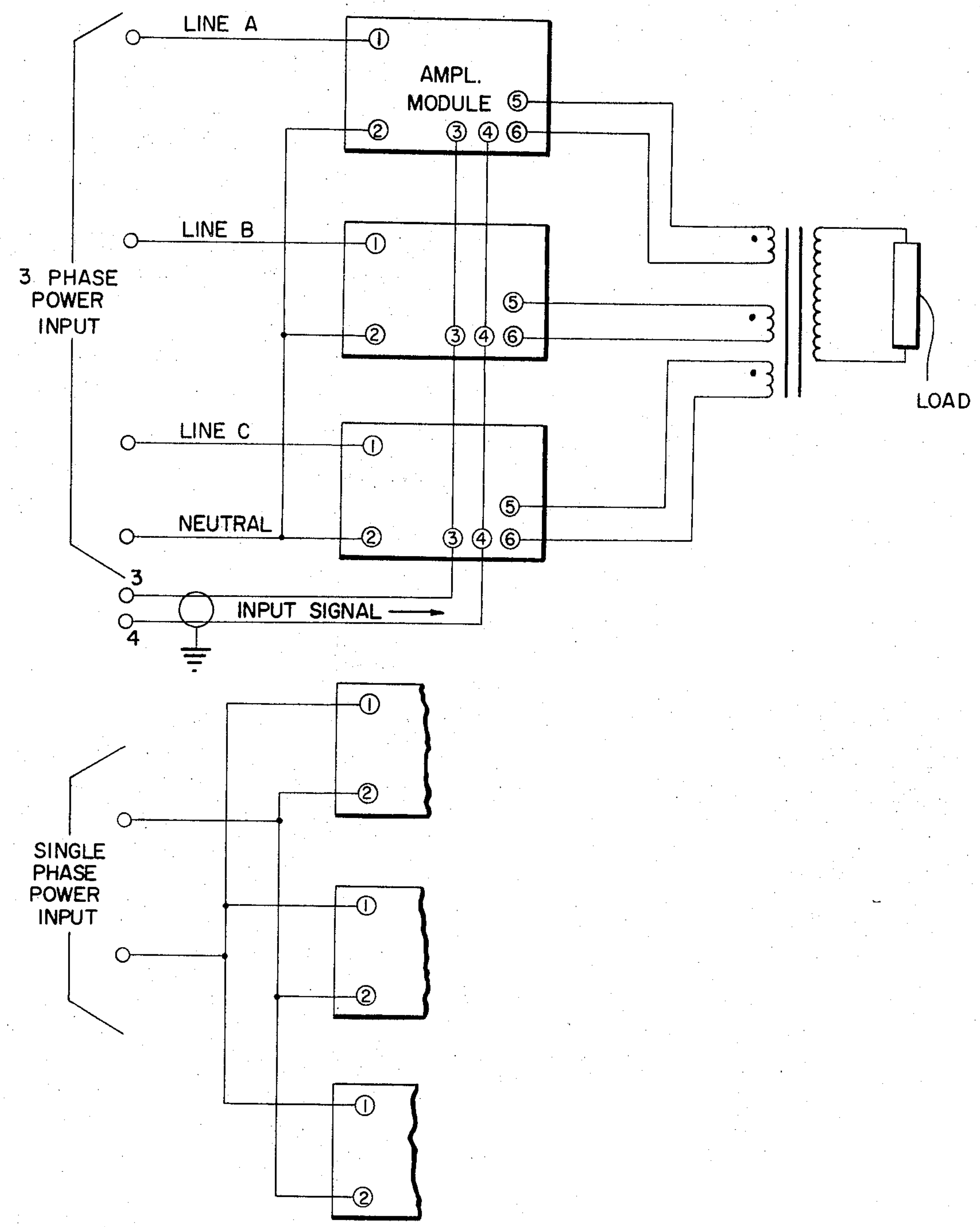

Practice of the present invention will become more apparent from the detailed description which follows taken in conjunction with the figures wherein:

FIG. 1 presents a schematic diagram of a transistorized audio amplifier of the present invention, FIG. 2 illustrates a driver transformer magnetic structure for use in the circuit of FIG. 1, FIG. 3 illustrates a schematic diagram of an internal limited range D.C. regulated power supply useful to drive the amplifier of FIG. 1, and FIG. 4 illustrates typical three phase and single phase arrangements for inducing higher output power assemblies to operate the present amplifier.

Referring to the drawings, FIG. 1 presents a schematic diagram of the overall system of the present invention. Power transistors Q1A to D through Q4A to D form a power output bridge circuit. It is recognized that the number of transistors per arm of the bridge is not restricted to four transistors but for clarity, four transistors are shown as a set, each transistor containing an equalizing emitter resistor. Power transistor Q1 set is driven simultaneously with the power transistor Q4 set, while power transistor Q2 set and Q3 set are driven identically except 180° out of phase. Diode CR7A in conjunction with resistor R7 biases the power transistor Q1 set "on" slightly to overcome the natural base voltage offset of the power transistors.

The emitter resistors of each transistor shown have little effect for temperature stabilization. Diode CR8B shunts the drive current to the power transistors to allow full A.C. drive. Diodes CR6A and CR6B operate to bias power transistor Q2 set in a like manner.

Power transistor Q3 and Q4 sets operate differentially thus they stabilize the quiescent D.C. drawn by the complete power transistor bridge from the D.C. supply appearing across C1. Both power transistor sets Q3 and Q4 are biased "on" through resistors R9 and R10 and CR4.

Common emitter resistor R5 stabilizes the transistor current through strong degenerative feedback. At the condition of no output, the total quiescent current through the bridge flows directly through *R5*, the D.C. level established on CR4 is compared to the voltage across *R5*. The difference is fed to the bases of Q3 and *Q*4 through the windings of T2, making the quiescent current proportional to $V_{CR4}-V_{BE}/R5$ where $V_{CR4}$ is the forward drop of CR4, $V_{BE}$ is the knee in the base to emitter turn-on voltage of Q3, Q4. Strong temperature stabilization occurs since $V_{CR4}$ and $V_{BE}$ are matched. If silicon power transistors are used, then *CR*4 is silicon resulting in like temperature variations. The small quiescent current results in the elimination of the familiar cross-over distortion, making the bridge system operate nearly at ideal class B.

Now, R7=R8=R9=R10 and the voltage across CR4, 5, 6, 7 is negligibly small. In the quiescent condition Q1 and Q2 act as emitter followers with Q3 acting as the emitter resistor for Q1 and Q4 acting as the emitter resistor for Q2. Thus, the quiescent collector-emitter voltages of all four power transistors are stabilized and equal one half the power supply voltage.

Common emitter resistor *R5*, since it is of relatively high resistance, would disturb the amplifier operation when output power is required. Power diode CR3 limits the voltage build-up across resistor *R5* to approximately 1 volt and also reduces the power waste thereof. Germanium diode CR5 provides a path for full A.C. drive. That is, when the base drive signal currents to Q3, Q4 exceeds the forward bias current in CR4, the base currents will bypass *R5* and switch through CR5. CR5, being germanium has a lower forward drop than silicon diode, CR4, thus, the current transfer occurs smoothly eliminating crossover distortion.

Diode $CR7_a$ and R7 provide the "on" bias for Q1, diode $CR6_a$ and R8 provide the "on" bias for Q2. As described above, the quiescent current in the bridge is controlled by the Q3, Q4 bias system. The quiescent operating collector to emitter voltages are set by the emitter follower action of Q1 to R7 and R9 voltage divider and Q2 to R8 and R10 voltage divider.

Diodes $CR7_b$ and $CR6_b$ are germanium. When the base drive currents in Q1 and Q2 exceed the forward bias currents in $CR7_a$, $CR6_a$, the base current will transfer smoothly through $CR7_b$ and $CR6_b$. Temperature stabilization is achieved by the matching of the base-emitter current/voltage knee and the forward drop temperature characteristic of $CR7_a$ and $CR6_a$.

The bases of each transistor in each bridge arm are connected directly. The emitter resistors ($R1_{a\ to\ d}$, $R2_{a\ to\ d}$, $R3_{a\ to\ d}$, $R4_{a\ to\ d}$) are equal. Thus, due to strong emitter feedback, the collector currents are equalized.

It is recognized that the power transistor bridge arms are not limited to four transistors. Any number can be used. Four are used in this discussion to serve for illustration of the principles.

A.C. output is achieved by alternatively turning opposite pairs of transistor sets "on". In order to avoid distortion, the transistors must be turned "on" identically. The driver transformer T2 and its associated circuitry are arranged to accomplish this function.

FIG. 2 shows the magnetic structure of driver transformer T2. The transformer is constructed typically on an "E-I" laminated magnetic steel core with two identical coils wound on the outer legs of the core. Each of the coils consists of four windings, quadrafile wound. Each half of the power transistor bridge sets is connected to opposite coils. Driver transistors Q5 and Q6 are connected to driver transformer T2 such that the collector current of each transistor drives each coil differentially.

To explain the forced equalization of the base drive currents of the opposite arms of the power transistor bridge, assume that A.C. drive current is forced into winding 1-2 and windings 9-10 and 11-12 are loaded.

The magnetic shunt offers a low reluctance path to the flux A.C. fluxes $\Phi_A$ and $\Phi_B$ of coils A and B. Thus, flux $\Phi_A$ induces little voltage in coil 11-12 and flux $\Phi_B$ induces little voltage in coil 9-10. Now, by the equal ampere-turn law, secondary current in winding 9-10 equals $I(N_1/N_2)$ and the secondary current in winding 11-12 equals $I(N_1/N_2)$. Thus differences or non-linearities in the actual load impedances of windings 9-10 and 11-12 do not affect the induced currents. In this manner, the simultaneous base drive currents for the power transistor Q1 set and that of the Q4 set are identical. Due to the strong feedback action of the emitter resistors the transistors are essentially constant current devices whose output is equal to the base drive current times the current gain of the arms, the collector current build-up in Q1 and Q4 with signal are identical. If this technique were not followed, and the opposite arms of the power bridge were driven through a single magnetic core, the upper set of transistors would be forced to turn "on" first and then draw current away from its mating set, resulting in large distortion of the output wave form.

In like manner windings 7-8 and 5-6 are controlled.

In the actual system of FIG. 1, windings 1-2 and 3-4 are driven differentially so that the driving MMF in each drive coil is proportional to the difference in collector currents of Q5, Q6 multiplied by $N_1$. Since the power bridge transistors are operated in class B and the base-emitter junctions allow only unidirectional currents, the forced equalization of the base drive currents alternate.

Drive transistors Q5 and Q6 are directly coupled to preamplifier transistors Q7 and Q8. The quiescent current is stabilized for variations of the transistors by means of a set of sensing resistors R17, R18, and R19 operating from the zener reference diode CR13. Preamplifier transistors Q7 and Q8 are complimentary to transistors Q5 and Q6.

Reference diode CR13 establishes the operating bias voltage. This voltage turns transistors Q7 and Q8 "on" which, in turn, forces transistors Q 5 and Q6 "on" through the direct collector-base coupling. The sum of the collector current of Q5 and Q6 is sensed in common collector resistor R17, which is also common to the emitters of the low current preamplifier transistors Q7 and Q8. Due to the direct emmiter-coupled feedback, voltage across resistor R17 is just large enough to equal the reference zener voltage minus the base-emitter offset voltage of transistors Q7 and Q8. Thus, the sum of the collector currents is determined only by the value of the zener voltage and the values of the sensing resistors. In this manner the quiescent current is stabilized for variations in the low voltage supply (across C2). In this manner the quiescent current in the driver is kept at the exact amount required for linear operation without power waste to allow for temperature variation.

The collector current of transistor Q5 is also sensed by sensing resistor R18 which is common to the emitter of transistor Q7, but not that of transistor Q8. Transistors Q6 and Q8 are related in a similar manner through R19. The resulting feedback produces a strong balancing action of the steady state currents of the driver transistors, preventing saturation of the driver transformer T2. This feedback also forces the differential collector currents of Q5 and Q6 to be directly proportional to the difference in base drive A.C. signal voltages in Q7 and Q8. Thus, the drive coils differential current of T2 are directly proportional to the algebraic sum of the two base drive signals. This allows a common connection between the drive and the feedback signals to the pre-amplifier. The feedback signal is derived through a tightly coupled winding on the feedback transformer T7. Since the system gain is high, the output voltage is then equal to the input signal times the ratio of precision resistors R14 and R20 plus R21. The net result is a stabilized inner voltage-to- current feedback loop controlled by a voltage-to-voltage stabilized outer feedback loop.

The system is protected from overload damage through the action of a "foldback" circuit in the overload detector. Diode bridge CR9 produces a voltage that is proportional to the unit output voltages whereas diode CR10 produces s signal voltage that is proportional to the unit output current. The proportion of the two voltages is adjusted in resistor R8. The "output voltage" signal tends to produce an "off" signal to the base-emitter of transistor Q9. The "output current" signal tends to produce an "on" signal to the base-emitter transistor Q9. If the output current increases beyond the preset ratio equal to the minimum desired value of the magnitude of the load impedance, transistor Q9 will turn "on." This will drop the zener reference voltage to a low value, disabling the driver stage. The output current from the power transistor bridge will drop to a low value and remain there until the load impedance returns to the normal safe value. This protects the amplifier against accidental overload. A parallel assemblage of like amplifier units will have the same action.

The maximum theoretical efficiency of a Class B amplifier is 77 percent. Losses increase rapidly if the D.C. supply voltage rises higher than the value corresponding to the point of "bottoming" of the output voltage wave form. This is prevented by the novel internal limited range D.C. regulated power supply. FIG. 3 shows the basic circuit used to accomplish regulation without the introduction of extra weight or ripple voltage.

Transformer T1 is shown as a tapped autotransformer, for minimum weight. Where isolation of a direct coupled load to the power transistor bridge is desired, T1 could be provided with a separate input isolation winding. Rectifier bridge CR1 is connected to the low voltage tap, 3, of T1. The common connection of SCR1 and SCR2 is connected to the high voltage tap, 4, of T1.

With no gating pulses supplied to SCR1, SCR2, CR1 acts as a simple rectifier and the unfiltered output is the familiar full wave rectified sinusoid. However, if at some time during the conduction period of, say, $CR1_a$ plus $CR1_b$, SCR2 is gated on, $CR1_a$ is blocked and the output current will be forced to jump from tap 3 to tap 4 of T1 and flow through SCR2 and $CR1_b$. This will produce a step in the unfiltered output wave, as shown in FIG. 3. Identical action occurs in the alternate half cycle of power through SCR1 and $CR1_a$. It should be noted that the unfiltered wave form is the familiar full wave rectified sinusoid at both no SCR firing and full SCR firing, where full firing of the SCR's corresponds to maximum output D.C. voltage.

Tap 4 is chosen so that, at lowest line input and maximum load, full SCR firing will produce the desired filtered output D.C. voltage. Tap 3 is chosen so that, at highest line input voltage and and minimum load, zero SCR firing will produce the desired filtered D.C. voltage.

The ripple content of the rectifier wave remains substantially unchanged for SCR firing angles between zero and full. Thus, a secondary winding on L1 with turns ratio proportional to the low power to high power D.C. voltage ratio aids in low voltage filtering by bucking out most of the ripple voltage from CR2, thus keeping the power system weight minimum.

The "Power Regulator" section shown in FIG. 1 typifies the kind of fast response pulse controller that can be used with this tap changed D.C. supply. CR12 is a voltage sensitive trigger diode. C3 charges through R7 from the unfiltered high power output. When the voltage on C3 reaches the firing threshold of CR12, C3 will discharge into T6, producing a firing pulse into SCR1, SCR2.

Transistor Q10 bleeds off charging current from C3. The rate bleed-off is determined by the difference in zener voltage (CR11) and the proportion of filtered D.C. output voltage feedback to Q10 base through R7 and R10. Thus, the rate at which Q10 bleeds off the charge on C3 is proportional to the error in the high power filtered D.C. voltage appearing on C1.

Pulse transformer T5 and CR8 provides synchronizing pulses that triggers Q10 "on" during power line cross-over, forcing C3 voltage build-up to commence from the same low point, approximately CR11 zener voltage, for each half cycle.

The fast closed-loop regulator is accomplished since all the error sensing and firing presetting occurs in that fraction of the power line half cycle between zero crossing and SCR firing. The transient response of the D.C. system is thus identical with the simple non-controlled rectifier-filter system.

For higher output power assemblies, the present units may be operated in parallel because of the forced currents drive to the output power bridge. A common output transformer may be used. FIG. 4 shows typical three phase and single phase power line input arrangements for this purpose.

As previously described, the output currents on each module are proportional to the A.C. signal input. Terminals 3 and 4 are the direct connections of the base drive signals. Thus, the output currents of each amplifier module are forced to be equal due to the internal voltage-to-current feedback circuits. The output current of the array of amplifier modules is equal to the output current of one times the number of units used.

When the units are connected in a three phase array, the loadings on the power input lines are equal. This is a result of the identical D.C. voltage settings of each module and the tight feedback loops in each. Units can be paralleled for single phase operation and the single phase sets may be arranged in the three phase arrangements shown.

The present amplifier may be used individually, or in combinations as desired to provide high frequency acoustic power source useful for fixed or variable frequency sonar transducer drivers.

Although it is recognized that the amplifier system of the present invention may be used in numerous ways, only a preferred embodiment thereof has been illustrated and accordingly it is to be understood that various changes and modifications may be made in the construction and arrangement of elements without departing from the spirit and scope of the invention as defined.

What is claimed is:

1. A bridge audio amplifier comprising a current transformer having several secondary coils having identical current outputs of the same polarity, and a bridge comprising transistors with collectors-emitters interconnected in each arm of the bridge, the base of each transistor being connected to one end of one of said secondary coil windings, the emitters of each upper arm being connected to one end of an anti-parallel diode network, the other ends of two of the same coils being connected to the bases other ends of the anti-parallel diode networks, the collectors of said upper arm transistors connected to a source of D.C. power, the other end of the remaining coils being connected in common and said same common connection being connected to the junction of two series-connected diodes, a resistor connected in parallel to said series diodes, the remote anode from said junction being connected to the common emitter connection of the lower arms of said transistor bridge, and the remote cathode from said junction being connected to the return of said source of D.C. power.

2. The bridge audio amplifier as defined in claim 1 wherein each of the upper two arms Q1, Q2 of said class B bridge power transistor array comprises at least one transistor or a plurality of transistors connected in parallel, two diodes $CR7_{a,b}$ or $CR6_{a,b}$ connected anti-parallel to each other and a resistor R7 or R8, one terminal of said anti-parallel diodes connected to the common emitter circuit of said transistor arm, the other terminal of the said anti-parallel diodes connected to one terminal of said resistors R7 and R8, the other terminal of said resistor connected to the collector of said transistor arm, and the collectors of said upper two arm transistors Q1, Q2 connected to a source of D.C. power, and wherein each of the lower two arms Q3, Q4 of said Class B bridge power transistor array comprises at least one transistor or a plurality of transistors in parallel, the emitter circuits of said lower two arms connected to one terminal of a resistor *R5*, the other terminal of said emitter circuit connected resistor connected to the return of said D.C. source of power, a pair of series connected diodes CR4, CR5 wherein the common terminal of said series connected diodes is connected to the junction of terminals of a pair of resistors R9, R10, the other terminal of one of the said pair of resistors connected to the collectors of one of the lower arm transistors R9 to Q3 collector, the other terminal of the other of said pair of resistors connected to the collectors of the other of the lower arm transistors, the input current end CR5 of said series connected diodes connected to the junction of said lower arm transistors emitter circuit and said emitter connected resistor *R5* to Q3, Q4 emitter circuit, the output current end of said pair of series connected diodes CR4 connected to the return of said source of d.c. power and a diode CR3 whose current input terminal is connected to the emitter circuit of said lower arm transistors Q3, Q4 whose current output terminal is connected to the return of said source of D.C. power, and the emitter circuit of one of the said upper arm transistors Q1 connected to the collector circuit of one of the lower two arms of said lower arm transistors Q3, and the emitter circuit of the other of the said upper arm transistors Q2 connected to the collector circuit of another of the lower arm transistors Q4, and a pair of power output terminals, one terminal of said pair of power output terminals connected to one of the said upper and lower arm emitter-collector junctions Q1 emitters to Q3 collectors, the other terminal of said pair of power output terminals connected to the other of the said upper and lower arm emitter-collector junctions Q2 emitters to Q4 collectors, and a plurality of low resistance magnetically coupled two terminal sources of A.C. signal currents T2, one terminal of one of the said A.C. signal sources connected to the bases of an upper arm transistors, the other terminal connected to the junction of the associated resistor and anti-parallel diodes of the said upper transistor arm, one terminal of another of the said A.C. signal sources connected to the bases of the other upper arm transistors, the other terminal connected to the junction of the associated resistor and anti-parallel diodes of the said other upper transistor arm, one terminal of another of the said A.C. signal sources connected to the bases of a lower arm transistor, the other terminal of said A.C. signal source connected to the junction of the said series connected diodes, one terminal of another of the said A.C. signal sources connected to the bases of the other lower arm transistors, the other terminal of said A.C. signal source connected to the junction of said series connected diodes.

3. The bridge audio amplifier as defined in claim 2 wherein the said collector connected resistors on each of the two side arms of said bridge power transistor array comprise means to form a voltage divider, having the bases of each of said upper two arms of said bridge power transistor array connected to the mid-potential point of said voltage divider, wherein at no A.C. signal input current from the said low resistance magnetically coupled sources of A.C. signal currents, wherein the D.C. voltage between the emitter circuits of each of the said upper arm transistors to the return of said source of D.C. power follows the mid-potential point of said voltage dividers.

4. The bridge audio amplifier as defined in claim 3 wherein said fixed D.C. voltage between said upper arm transistors and the return of said source of D.C. power comprises means for producing stabilized quiescent D.C. collector to emitter voltage on all four arms of the said bridge power transistor array.

5. The bridge audio amplifier as defined in claim 2 wherein the junction point of said series connected diodes has a fixed D.C. voltage equal to the forward drop of the current output diodes of said pair of series connected diodes, wherein the said D.C. voltage at no A.C. signal input currents from the said low resistance magnetically coupled sources of A.C. signal currents is applied to the bases of the said lower arm transistors, wherein the D.C. voltage between the emitters of the said lower arm transistors and the return of said source of D.C. power follows the D.C. voltage across the said current output diode of said pair of series connected diodes, wherein the current through the said resistor connected between the emitter circuits of the lower arm transistors and the return of the said source of D.C. power is fixed proportional to the said emitter voltage and wherein the forward conduction potential across the said diode connected across the said resistor is greater than the voltage across the said resistor at no A.C. signal input current.

6. The bridge audio amplifier as defined in claim 5 wherein said fixed D.C. current through the said resistor connected to the emitter circuits of the said lower arms transistors and the return of the D.C. power source comprises means for producing stabilized quiescent D.C. current through all four arms of said transistor array.

7. The bridge audio amplifier as defined in claim 2 wherein the said plurality of magnetically coupled sources of A.C. signal currents produces all A.C. signal current means simultaneously, said A.C. signal currents that flow into the bases of the transistors of said upper two arms of said power transistor bridge phased 180° with respect to each other, said A.C. signal currents that flow into the bases of the transistors of the opposite arms of said power transistor bridge array phased at 0° with respect to each other, said A.C. signal currents that flow into the bases of the upper arms of said power transistor bridge array flow through the anti-parallel diodes coacting with each of the upper arms of said power transistor bridge array, and the said base drive currents of the said lower two arms flow through the said series connected diode pair coating with the lower two arms of said power transistor bridge array.

8. The bridge audio amplifier as defined in claim 7 wherein the said anti-parallel diodes coacting with the said upper transistor arms coact with the A.C. signal currents flowing through them to form direct paths for the A.C. signal currents to flow between the bases, and emitter circuits in each of the upper two arms of the said power transistor bridge comprises means for disabling the said D.C. collector to emitter voltage stabilization of the said power transistor bridge when A.C. signal input current exists independent of the frequency.

9. The bridge audio amplifier as defined in claim 7 wherein the said series connected diodes coacting with the said lower transistor arms coact with the A.C. signal currents flowing through them to form a direct path for the A.C. signal currents to flow between the bases and the emitter circuits of each of the lower two arms of said power transistor bridge comprises means for disabling the said D.C. current stabilization of the said power transistor bridge array when A.C. signal input currents exist independent of the frequency of these currents.

10. The bridge audio amplifier as defined in claim 2 wherein the said magnetically coupled sources of A.C. signal currents is a three-legged transformer with identical windings on the outer legs and no windings on the inner leg forming a magnetic shunt, said outer leg windings consisting of at least three coils, at least two of the said coils having equal turns, said equal coils being the secondary coils and the remaining coils of the said winding being the primary coils, and at least one primary coil of one of the said outer legs is connected in series with at least one identical primary coil of the outer leg coacting so that the magnetic flux produced in each leg when A.C. signal currents flow in said series connected primary is summed in the said magnetic shunt to provide means for suppressing flux linkage between the said two outer leg windings thereby providing means for the induced A.C. flux level in one of the said outer legs to be independent of the flux level in the other.

11. The bridge audio amplifier as defined in claim 10 wherein the secondary coils of one of the said outer legs of the said transformer form the magnetically coupled A.C. base drive signal current means for one pair of adjacent upper and lower arms of said power transistor bridge array, and the secondary coils of the other said outer leg form the magnetically coupled base drive A.C. base drive signal means for the other pair of adjacent upper and lower arms of said power transistor bridge forming means for opposite arms of the said power transfer bridge to receive identical base drive A.C. signal currents independent of the voltage reflected back to the secondary coils by the said transistor bases.

12. The bridge audio amplifier as defined in claim 11 wherein the anti-parallel diodes of an upper arm of said power transistor array and the series connected diodes of the lower arm of the said power transistor array are forced into conduction simultaneously when A.C. signal currents exist, forming means for opposite arms of the said power transistor bridge to conduct current simultaneously when A.C. signal current exists and forming means for eliminating cross-over distortion.

* * * * *